US012660548B2

(12) United States Patent
Lee et al.

(10) Patent No.: US 12,660,548 B2
(45) Date of Patent: Jun. 16, 2026

(54) ASC PROCESS AUTOMATION DEVICE

(71) Applicant: SK SILTRON CO., LTD., Gumi-si (KR)

(72) Inventors: Ho Yong Lee, Gumi-si (KR); Sung Ho Kim, Gumi-si (KR); Jae Min Seok, Gumi-si (KR)

(73) Assignee: SK SILTRON CO., LTD., Gumi-si (KR)

( * ) Notice: Subject to any disclaimer, the term of this patent is extended or adjusted under 35 U.S.C. 154(b) by 614 days.

(21) Appl. No.: 17/917,657

(22) PCT Filed: Aug. 13, 2020

(86) PCT No.: PCT/KR2020/010737
§ 371 (c)(1),
(2) Date: Oct. 7, 2022

(87) PCT Pub. No.: WO2021/246573
PCT Pub. Date: Dec. 9, 2021

(65) Prior Publication Data
US 2023/0154767 A1 May 18, 2023

(30) Foreign Application Priority Data

Jun. 1, 2020 (KR) ........................ 10-2020-0065784

(51) Int. Cl.
*H10P 72/70* (2026.01)
*B28D 5/00* (2006.01)
(Continued)

(52) U.S. Cl.
CPC ........ *H10P 72/0414* (2026.01); *B28D 5/0082* (2013.01); *H10P 90/18* (2026.01); *H10P 72/7442* (2026.01)

(58) Field of Classification Search
CPC ......... H01L 21/67051; H01L 21/02035; H01L 2221/68386; B28D 5/0082; H10P 72/0414; H10P 72/7442; H10P 90/18
See application file for complete search history.

(56) References Cited

U.S. PATENT DOCUMENTS 5,950,643 A * 9/1999 Miyazaki ............. B28D 5/0082
134/76
2015/0202797 A1 * 7/2015 Nakamoto ............. B28D 5/045
125/21
(Continued)

FOREIGN PATENT DOCUMENTS

CN 205940134 2/2017
CN 111152375 A * 5/2020 ............. B23K 26/36
(Continued)

OTHER PUBLICATIONS

Chinese Office Action dated Jun. 8, 2024 issued in Application No. 202080100310.4.
(Continued)

*Primary Examiner* — Jeff W Natalini
*Assistant Examiner* — Ian Isaac Degrasse
(74) *Attorney, Agent, or Firm* — KED & ASSOCIATES, LLP

(57) ABSTRACT

The present invention provides an ASC process automation device including: a loading part into which an ingot having been subjected to a wire sawing is input; a kerosene cleaning part for cleaning the ingot with kerosene; a precleaning part for precleaning the ingot; a main cleaning part for cleaning the ingot multiple times; a wafer peeling part for peeling the ingot to produce multiple wafers; and a transport unit for moving the ingot linearly and upward/downward while proceeding to the kerosene cleaning part, the precleaning part, the main cleaning part, and the wafer peeling part.

7 Claims, 4 Drawing Sheets

(51) Int. Cl.
  H10P 72/00     (2026.01)
  H10P 90/00     (2026.01)

(56)       References Cited

U.S. PATENT DOCUMENTS

| | | | | |
|---|---|---|---|---|
| 2017/0309472 | A1 * | 10/2017 | Hanawa | ..................... G03F 1/82 |
| 2022/0072660 | A1 * | 3/2022 | Shi | ..................... B23K 37/0408 |

FOREIGN PATENT DOCUMENTS

| | | | |
|---|---|---|---|
| EP | 0762483 | | 3/1997 |
| JP | 2010-080829 | | 4/2010 |
| JP | 2010080829 | A * | 4/2010 |
| KR | 10-0230625 | | 11/1999 |
| KR | 10-2009-0020905 | | 2/2009 |
| KR | 10-1586940 | | 1/2016 |
| KR | 2020-080829 | | 6/2020 |

OTHER PUBLICATIONS

International Search Report dated Feb. 10, 2021 issued in Application No. PCT/KR2020/010737.

* cited by examiner

【FIG. 1】
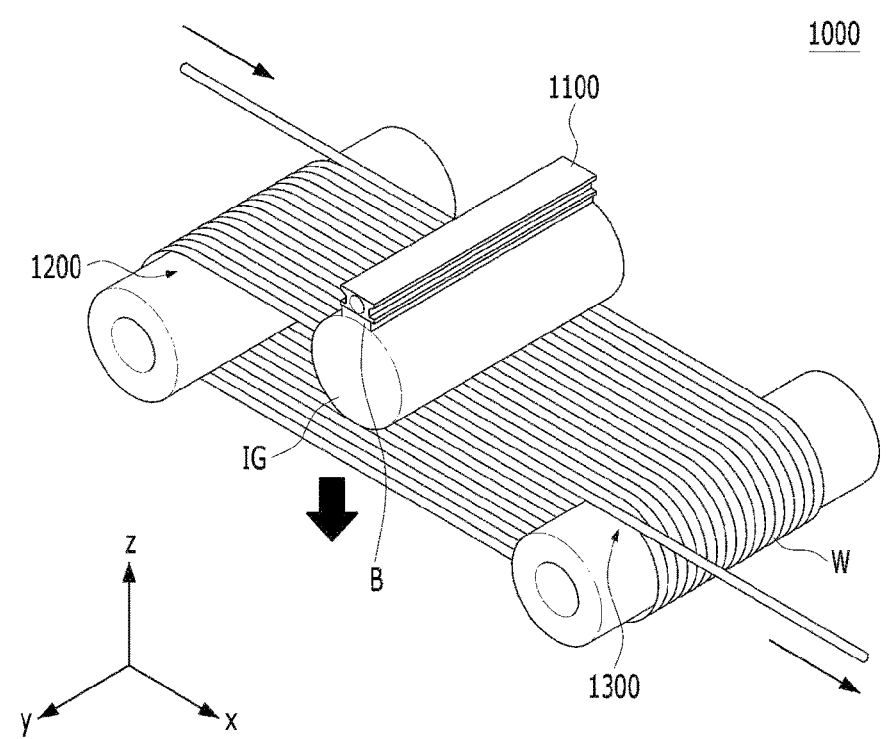
【FIG. 2】
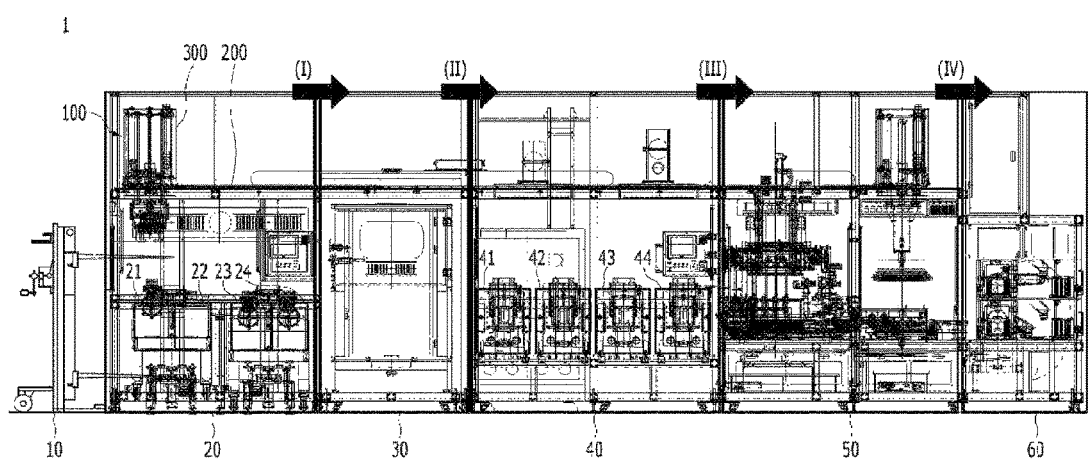

【FIG. 3】
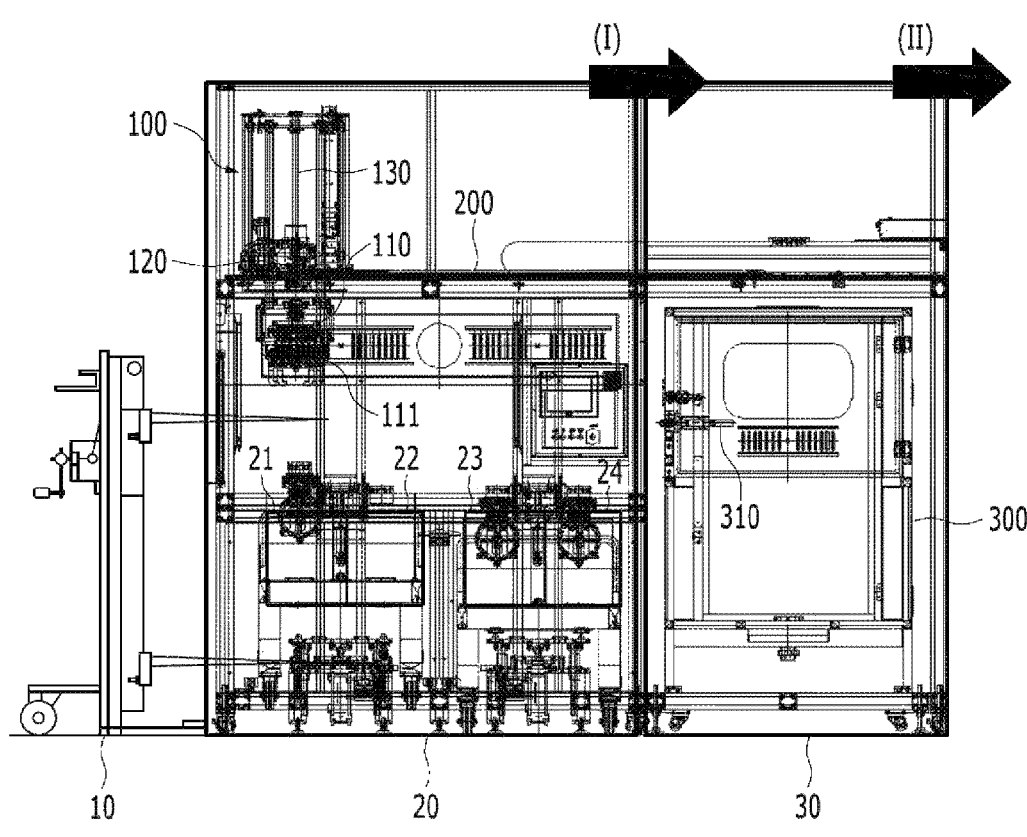

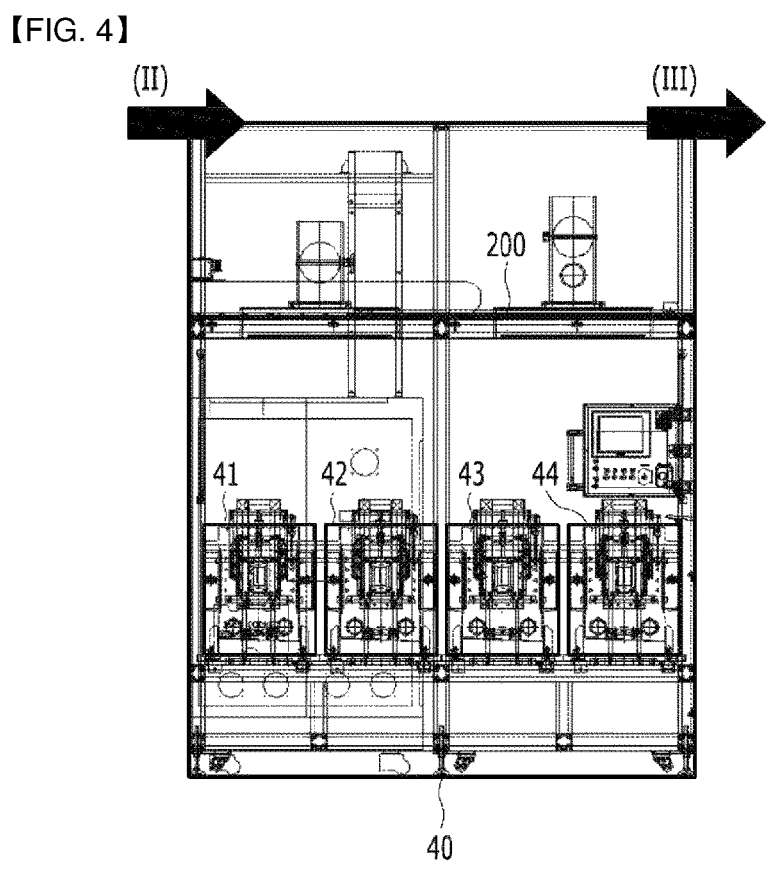

【FIG. 4】

【FIG. 5】
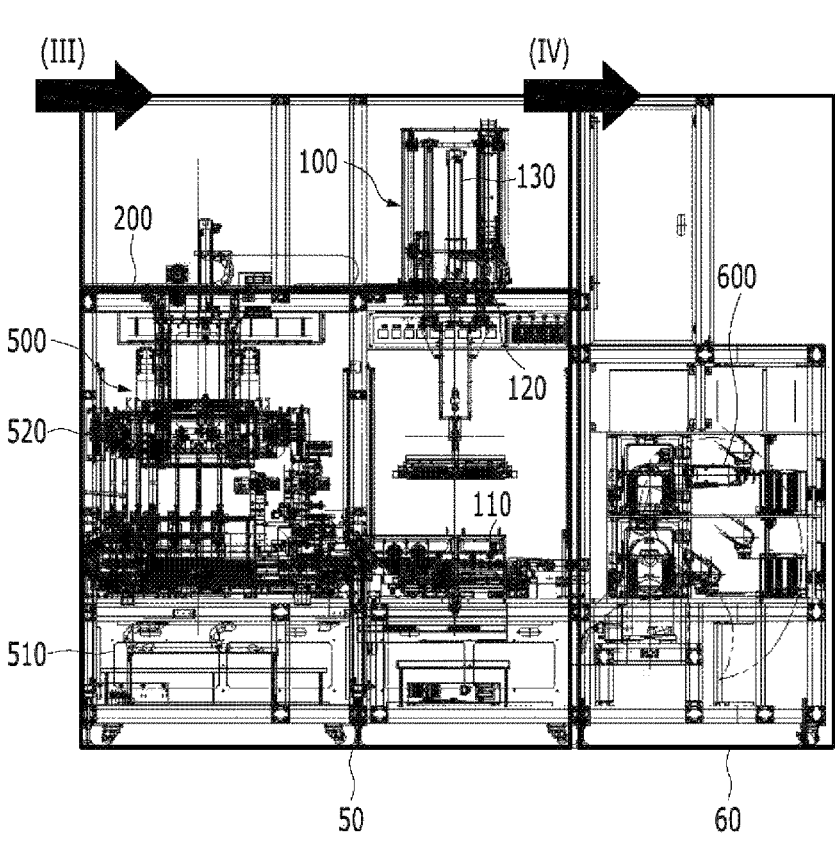

ASC PROCESS AUTOMATION DEVICE

CROSS-REFERENCE TO RELATED PATENT APPLICATIONS

This application is a U.S. National Stage Application under 35 U.S.C. § 371 of PCT Application No. PCT/KR2020/010737, filed Aug. 13, 2020, which claims priority to Korean Patent Application No. 10-2020-0065784, filed Jun. 1, 2020, whose entire disclosures are hereby incorporated by reference.

TECHNICAL FIELD

The present invention relates to a wafer-manufacturing apparatus, and more particularly to an automated ASC process apparatus for performing an ASC process.

BACKGROUND ART

A single-crystal silicon ingot is generally grown and manufactured through the Czochralski method. This method is a method in which a polycrystalline silicon is melted in a crucible in a chamber, a seed crystal, which is a single crystal, is immersed into the silicon melt, and the seed crystal is slowly pulled up to grow a single-crystal silicon ingot (hereinafter referred to as an "ingot") having a desired diameter.

A single-crystal silicon wafer manufacturing process broadly includes a single-crystal growing process for producing an ingot, a slicing process for slicing the ingot to obtain a thin disc-shaped wafer, an edge grinding process for machining the edge of the wafer obtained through the slicing process in order to prevent cracking and warpage of the wafer, a lapping process for removing damage to the wafer due to mechanical processing in order to improve the flatness of the wafer, a polishing process for mirror-polishing the wafer, and a cleaning process for removing an abrasive or foreign substances adhered to the polished wafer.

Meanwhile, the slicing process in which the ingot is cut into wafers is performed using a wire sawing apparatus.

FIG. 1 is a view showing the operation of a general wire sawing apparatus.

As shown in FIG. 1, the wire sawing apparatus 1000 includes a beam B for fixing the upper portion of an ingot IG, an ingot clamp 1100 for clamping the beam B so that the ingot IG is supported so as to be moveable upwards and downwards, a plurality of rollers 1200 and 1300 provided below the ingot clamp 100 so as to be rotatable, a wire W wound around the plurality of rollers 1200 and 1300 so as to be rotatable in forward and reverse directions, and a slurry ejection nozzle (not shown) for ejecting slurry toward the wire W.

In the wire sawing apparatus 1000, slurry is ejected onto the wire W that is moving at a high speed, and the ingot IG descends toward the wire W. In this case, the ingot IG is cut into a plurality of wafers by friction with the slurry adhered to the wire W.

When the wire sawing process is completed, an as sliced cleaning (ASC) process, which includes a series of processes of removing foreign substances, such as slurry, oil, or cutting chips, from the wafers and removing the beam B secured to the upper portions of the wafers to separate the wafers, is further performed as a step preceding the above-described edge grinding process.

The ASC process is performed by an ASC process apparatus, in which various devices are combined. The ASC process apparatus sequentially performs procedures required for the ASC process, such as cleaning using kerosene (WN-420), loading, ultra cleaning, primary rinsing, secondary rinsing, tertiary rinsing, wafer separation, and unloading.

However, many procedures for the ASC process and many connecting sections (progression sections) between the procedures are performed manually, rather than in an automated manner. Such manual labor causes degradation in the quality of the ASC process (generation of stains on the surface of a wafer, non-uniform cleaning, damage to a wafer, or the like) depending on the proficiency level of a worker, and is more time-consuming and expensive.

DISCLOSURE

Technical Problem

Therefore, the present invention provides an ASC process automation apparatus capable of automating respective procedures of an ASC process and connecting sections (progression sections) between the procedures, thereby improving the quality of the ASC process and saving time and expenses.

Technical Solution

The present invention provides an ASC process automation apparatus including a loading unit configured to allow an ingot subjected to wire sawing to be loaded thereon, a kerosene cleaning unit configured to clean the ingot using kerosene, a pre-cleaning unit configured to pre-clean the ingot, a main cleaning unit configured to clean the ingot multiple times, a wafer separation unit configured to split the ingot into a plurality of wafers, and a conveying unit configured to convey the ingot linearly and move the ingot upwards and downwards while passing by the kerosene cleaning unit, the pre-cleaning unit, the main cleaning unit, and the wafer separation unit.

The apparatus may further include a rail unit mounted along the kerosene cleaning unit, the pre-cleaning unit, the main cleaning unit, and the wafer separation unit, and the conveying unit may be mounted to the rail unit.

The conveying unit may include a clamping unit configured to clamp the ingot, a linear conveying unit mounted so as to be linearly movable along the rail unit, and an upward/downward conveying unit configured to move the clamping unit upwards and downwards.

The clamping unit may include a clamp configured to selectively hold or release two opposite points on the outer circumference of the ingot.

The linear conveying unit may include a first motor and a wheel movably mounted to the rail and configured to be rotated by the first motor.

The upward/downward conveying unit may include a second motor and a wire coupled to the clamping unit and configured to be adjusted in length by the second motor.

The kerosene cleaning unit may include a plurality of kerosene baths, and the ingot may be sequentially immersed into the plurality of kerosene baths by the conveying unit.

The pre-cleaning unit may include a pre-cleaning tank and a spray nozzle configured to spray a cleaning liquid to the ingot introduced into the pre-cleaning tank by the conveying unit.

The main cleaning unit may include a first bath configured to perform ultra cleaning, a second bath configured to perform a primary rinsing process, a third bath configured to perform a secondary rinsing process, and a fourth bath configured to perform a tertiary rinsing process, and the ingot may be sequentially immersed into the first bath, the second bath, the third bath, and the fourth bath by the conveying unit.

The wafer separation unit may include a peeling unit configured to remove a beam adhered to the ingot conveyed by the conveying unit.

The peeling unit may include a peeling tank configured to store a liquid for peeling and to allow the ingot to be immersed thereinto and a beam separator configured to separate the beam from the ingot located in the peeling tank.

The conveying unit may put the ingot into the peeling tank such that the beam is located on the upper portion of the ingot, the beam separator may remove the beam in the longitudinal direction of the beam at a position above the peeling tank, and the removed beam may be discharged outside by the conveying unit.

The apparatus may further include an unloading unit mounted adjacent to the wafer separation unit and configured to discharge the plurality of wafers outside.

The unloading unit may include an unloading robot configured to grasp the plurality of wafers and convey the plurality of wafers from the peeling tank.

The present invention provides an ASC process automation apparatus including an ingot formed such that a beam is attached to wafers, a conveying unit configured to convey the ingot linearly and move the ingot upwards and downwards, and a rail unit configured to allow the conveying unit to be mounted thereto. The conveying unit includes a clamping unit configured to clamp the ingot, a linear conveying unit mounted so as to be linearly movable along the rail unit, and an upward/downward conveying unit configured to move the clamping unit upwards and downwards.

Advantageous Effects

According to the ASC process automation apparatus of the present invention, respective procedures of an ASC process and connecting sections (progression sections) between the procedures are automated and thus are capable of being consecutively performed, thereby improving the quality of the ASC process and saving time and expenses.

DESCRIPTION OF DRAWINGS

FIG. 1 is a view showing the operation of a general wire sawing apparatus.

FIG. 2 is a front view schematically showing the configuration of an ASC process automation apparatus according to an embodiment of the present invention.

FIG. 3 is an enlarged view of the loading unit, the kerosene cleaning unit, and the pre-cleaning unit shown in FIG. 2.

FIG. 4 is an enlarged view of the main cleaning unit shown in FIG. 2.

FIG. 5 is an enlarged view of the wafer separation unit and the unloading unit shown in FIG. 2.

BEST MODE

Hereinafter, embodiments will be elucidated via description thereof with reference to the accompanying drawings. In the following description of the embodiments, it will be understood that, when an element such as a layer (film), region, pattern, or structure is referred to as being "on" or "under" another element such as a substrate, layer (film), region, pad, or pattern, it can be "directly" on or under the other element, or can be "indirectly" formed such that an intervening element may also be present. In addition, it will also be understood that the criteria for "on" or "under" is on the basis of the drawing.

In the drawings, elements may be exaggerated in size, omitted, or schematically illustrated for convenience in description and clarity. Further, the sizes of elements do not indicate the actual sizes of the elements. Wherever possible, the same reference numbers will be used throughout the drawings to refer to the same parts. Hereinafter, embodiments will be described with reference to the accompanying drawings.

FIG. 2 is a front view schematically showing the configuration of an ASC process automation apparatus according to an embodiment of the present invention, FIG. 3 is an enlarged view of the loading unit, the kerosene cleaning unit, and the pre-cleaning unit shown in FIG. 2, FIG. 4 is an enlarged view of the main cleaning unit shown in FIG. 2, and FIG. 5 is an enlarged view of the wafer separation unit and the unloading unit shown in FIG. 2.

As shown in FIGS. 2 to 5, the ASC process automation apparatus 1 according to the embodiment may include a loading unit 10, a kerosene cleaning unit 20, a pre-cleaning unit 30, a main cleaning unit 40, a wafer separation unit 50, and an unloading unit 60.

The loading unit 10 may be configured as a mechanism or a device for introducing an ingot IG (hereinafter, refer to FIG. 1) that has been subjected to wire sawing into the kerosene cleaning unit 20. The ingot IG supplied through the loading unit 10 has already been cut into a plurality of wafers through a slicing process (a wire sawing process). A beam B (hereinafter, refer to FIG. 1) is in the state of being attached to the upper portions of the wafers by means of an adhesive material such as glue. Hereinafter, an element formed by coupling the beam B to the wafers so as to have the shape of an ingot IG (a cylinder) will be referred to as an "ingot IG", and an individual sliced element, which is detachably attached to the beam B, will be referred to as a "wafer".

The loading unit 10 may convey the above-described ingot IG from the wire sawing device to introduce the same into the kerosene cleaning unit 20. In an example, the loading unit 10 may be embodied as a loader 11, which includes a wheel mounted to the lower portion thereof and a shelf or a jig mounted to the upper portion thereof to support the ingot IG.

The ingot IG introduced into the kerosene cleaning unit 20 by the loading unit 10 may be subjected to a kerosene cleaning process by the kerosene cleaning unit 20. The kerosene cleaning unit 20 may remove alkali oil, which is contained in slurry used in the wire sawing process, from the surface of the wafer.

As shown in FIG. 3, the kerosene cleaning unit 20 may include a plurality of kerosene baths 21, 22, 23, and 24, into which the ingot IG is sequentially immersed by a conveying unit 100 to be described later. In an example, the number of kerosene baths 21, 22, 23, and 24 may be four, but the embodiments are not limited thereto. Different concentrations of kerosene may be stored in the respective kerosene baths 21, 22, 23, and 24. Of course, some of the plurality of kerosene baths 21, 22, 23, and 24 may be filled with a cleaning liquid other than kerosene.

The ingot IG may be sequentially immersed into the respective kerosene baths 21, 22, 23, and 24 for a predetermined amount of time. To this end, the conveying unit 100 may move the ingot IG downwards to immerse the same into one of the kerosene baths 21, 22, 23, and 24, may move the ingot IG upwards, may convey the ingot IG toward another of the kerosene baths 21, 22, 23, and 24, and may then move the ingot IG downwards thereinto.

Conventionally, the process of immersing the ingot IG into the kerosene baths 21, 22, 23, and 24 is performed manually by a worker. However, according to the present invention, the kerosene bath process may be automated in a manner such that the conveying unit 100 sequentially immerses the ingot IG into the plurality of kerosene baths 21, 22, 23, and 24.

The pre-cleaning unit 30 may perform a pre-cleaning process on the ingot IG subjected to kerosene cleaning.

The pre-cleaning unit 30 may perform a process for primarily (macroscopically) removing kerosene and foreign substances from the wafer as a step preceding the main cleaning step. Therefore, the pre-cleaning unit 30 may include a forcible and powerful means.

For example, as shown in FIG. 3, the pre-cleaning unit 30 may include a pre-cleaning tank 300 and a spray nozzle 310 for spraying a cleaning liquid to the ingot IG introduced into the pre-cleaning tank 300 by the conveying unit 100.

The pre-cleaning tank 300 may be provided therein with a fixing means for stably supporting the ingot IG conveyed by the conveying unit 100. The fixing means may be configured to rotate or move the ingot IG. The spray nozzle 310 may spray the cleaning liquid toward one side surface of the ingot IG, fixed to the fixing means, at a constant pressure. Here, the spray nozzle 310 may be mounted in the pre-cleaning tank 300 so as to be movable upwards and downwards in order to spray the cleaning liquid toward the opposite side surface of the ingot IG.

Conventionally, the pre-cleaning process is performed manually by a worker. However, according to the present invention, the pre-cleaning process may be automated in a manner such that the spray nozzle 310 is controlled to spray the cleaning liquid uniformly and stably toward the ingot IG conveyed into the pre-cleaning tank 300 by the conveying unit 100.

The main cleaning unit 40 may perform a process of cleaning the ingot IG multiple times (several times). To this end, the main cleaning unit 40 may include a plurality of baths.

For example, as shown in FIG. 4, the main cleaning unit 40 may include a first bath 41 for performing ultra cleaning, a second bath 42 for performing a primary rinsing process using DIW, a third bath 43 for performing a secondary rinsing process using DIW, and a fourth bath for performing a tertiary rinsing process using hot DIW (e.g. 80° C.).

The ingot IG, which is conveyed by the conveying unit 100, may be sequentially immersed into the first bath 41 to the fourth bath of the main cleaning unit 40 described above, and thus may be cleaned.

As shown in FIG. 5, the wafer separation unit 50 may split the ingot IG into a plurality of wafers. To this end, the wafer separation unit 50 may include a peeling unit 500 for removing the beam B from the ingot IG conveyed by the conveying unit 100.

For example, the peeling unit 500 may include a peeling tank 510, in which a liquid for peeling is stored and into which the ingot IG is immersed, and a beam separator 520 for separating the beam B from the ingot IG located in the peeling tank 510.

The conveying unit 100 may put the ingot IG into the peeling tank 510 such that the beam B is located on the upper portion of the ingot IG, and the beam separator 520 may remove the beam B in the longitudinal direction of the beam B (refer to the y-direction in FIG. 1) at a position above the peeling tank 510. In this case, the removed beam B may be discharged outside by the conveying unit 100.

Conventionally, in order to separate wafers, a worker immerses the ingot IG into a tank in which a liquid for peeling is stored, and waits for a predetermined time period until an adhesive adhered to the beam B and to the wafers dissolves. Then, the worker needs to manually separate the wafers from the upper portion of the beam B, which leads to damage to the wafers or secondary contamination thereof.

In contrast, according to the present invention, the processes of separating and discharging the wafers are performed by the peeling unit 500, the conveying unit 100, and the unloading unit 60 without the necessity of any manual labor by a worker, thereby shortening the processing time and improving the quality of the wafer separation process.

The unloading unit 60 may be mounted adjacent to the wafer separation unit 50, and may discharge the plurality of wafers outside. The unloading unit 60 may be embodied as an unloader 600 including an unloading robot configured to grasp the plurality of wafers and convey the same from the peeling tank 510. In an example, the unloading robot may draw the plurality of wafers all together out of the wafer separation unit 50, or may individually draw the plurality of wafers one by one out of the wafer separation unit 50. In this case, a cassette such as a FOUP may also be used.

In addition, the present invention may further include the conveying unit 100 and a rail unit 200.

As shown in FIG. 2, the conveying unit 100 may convey the ingot IG linearly and may move the same upwards and downwards while consecutively passing by the kerosene cleaning unit 20, the pre-cleaning unit 30, the main cleaning unit 40, and the wafer separation unit 50 described above.

The rail unit 200 may be mounted along the kerosene cleaning unit 20, the pre-cleaning unit 30, the main cleaning unit 40, and the wafer separation unit 50, and the conveying unit 100 may be mounted to the rail unit 200. In an example, the rail unit 200 may be mounted in the longitudinal direction (the x-axis direction) so as to connect all of the parts of the ASC process apparatus. The rail unit 200 may be embodied as a single rail or a plurality of rails. Accordingly, the conveying unit 100 may move along the rail unit 200 so that the procedures of the ASC process are sequentially performed.

In an example, as shown in FIG. 3, the conveying unit 100 may include a clamping unit 110, a linear conveying unit 120, and an upward/downward conveying unit 130.

The clamping unit 110 may clamp the ingot IG. In an example, the clamping unit 110 may include a clamp 111 configured to selectively hold or release two opposite points on the outer circumference of the ingot IG. Here, as shown in FIG. 1, the ingot IG may be disposed such that the longitudinal direction thereof is parallel to the Y-axis direction, and the clamp 111 may selectively hold or release the front and rear points of the ingot IG in the X-axis direction. Accordingly, the ingot IG may be disposed by the conveying unit 100 such that the longitudinal direction thereof is parallel to the Y-axis direction, and may undergo the ASC process in the X-axis direction.

The linear conveying unit 120 may be mounted so as to be linearly movable along the rail unit 200.

Although not shown in detail, the linear conveying unit 120 may include a first motor and a wheel movably mounted to the rail and configured to be rotated by the first motor. Accordingly, the wheel may be linearly moved in the forward-backward direction along the longitudinal direction of the rail by rotation of the first motor in forward and reverse directions.

The upward/downward conveying unit 130 may move the clamping unit 110 upwards and downwards.

Although not shown in detail, the upward/downward conveying unit 130 may include a second motor and a wire coupled to the clamping unit 110 and configured to be adjusted in length by the second motor. Accordingly, the wire may move the clamping unit 110 upwards and downwards in the longitudinal direction of the wire (the Z-axis direction in FIG. 1) in response to rotation of the second motor in forward and reverse directions.

As described above, according to the ASC process automation apparatus of the present invention, respective procedures of the ASC process and connecting sections (progression sections) between the procedures are automated and thus are capable of being consecutively performed by the rail unit 200 and the conveying unit, thereby improving the quality of the ASC process and saving time and expenses.

The features, structures, effects, and the like described in association with the embodiments above are incorporated into at least one embodiment of the present invention, but are not limited only to the one embodiment. Furthermore, the features, structures, effects, and the like exemplified in association with respective embodiments can be implemented in other embodiments by combination or modification by those skilled in the art. Therefore, contents related to such combinations and modifications should be construed as falling within the scope of the present invention.

INDUSTRIAL APPLICABILITY

The ASC process automation apparatus according to the embodiment may be used for apparatuses for manufacturing a semiconductor element, a silicon wafer, or the like.

The invention claimed is:

1. An ASC process automation apparatus comprising:
   a loading unit configured to allow an ingot subjected to wire sawing to be loaded thereon;
   a kerosene cleaning unit configured to clean the ingot using kerosene;
   a pre-cleaning unit configured to pre-clean the ingot cleaned by the kerosene cleaning unit, thereby primarily removing the kerosene from the ingot;
   a main cleaning unit configured to clean the ingot multiple times;
   a wafer separation unit configured to split the ingot into a plurality of wafers;
   a conveying unit configured to convey the ingot linearly and move the ingot upwards and downwards while passing by the kerosene cleaning unit, the pre-cleaning unit, the main cleaning unit, and the wafer separation unit; and
   a rail unit mounted along the kerosene cleaning unit, the pre-cleaning unit, the main cleaning unit, and the wafer separation unit, wherein the conveying unit is mounted to the rail unit,
   wherein the conveying unit comprises:
      a clamping unit configured to clamp the ingot;
      a linear conveying unit mounted so as to be linearly movable along the rail unit; and
      an upward/downward conveying unit configured to move the clamping unit upwards and downwards,
   wherein the clamping unit comprises a clamp configured to selectively hold or release two opposite points on an outer circumference of the ingot, wherein the linear conveying unit comprises a first motor and a wheel movably mounted to the rail and configured to be rotated by the first motor,
   wherein the upward/downward conveying unit comprises a second motor and a wire coupled to the clamping unit and configured to be adjusted in length by the second motor,
   wherein the longitudinal direction of the ingot is parallel to the y-axis direction and the clamp selectively hold or release the front and rear points of the ingot in the x-axis direction which is perpendicular to the y-axis,
   wherein the kerosene cleaning unit comprises a plurality of kerosene baths, and the ingot is sequentially immersed into the plurality of kerosene baths by the linear conveying unit,
   wherein the kerosene stored in each respective kerosene baths has a different concentration,
   wherein the pre-cleaning unit comprises a pre-cleaning tank and a spray nozzle configured to spray a cleaning liquid to the ingot introduced into the pre-cleaning tank by the conveying unit, and
   wherein the spray nozzle is mounted in the pre-cleaning tank so as to be movable upwards and downwards in order to spray the cleaning liquid toward the opposite side surface of the ingot.

2. The ASC process automation apparatus according to claim 1,
   wherein the main cleaning unit comprises:
      a first bath configured to perform ultra cleaning;
      a second bath configured to perform a primary rinsing process;
      a third bath configured to perform a secondary rinsing process; and
      a fourth bath configured to perform a tertiary rinsing process, and
   wherein the ingot is sequentially immersed into the first bath, the second bath, the third bath, and the fourth bath by the conveying unit.

3. The ASC process automation apparatus according to claim 1, wherein the wafer separation unit comprises a peeling unit configured to remove a beam adhered to the ingot conveyed by the conveying unit.

4. The ASC process automation apparatus according to claim 3, wherein the peeling unit comprises:
   a peeling tank configured to store a liquid for peeling and to allow the ingot to be immersed thereinto; and
   a beam separator configured to separate a beam from the ingot located in the peeling tank.

5. The ASC process automation apparatus according to claim 4, wherein the conveying unit puts the ingot into the peeling tank such that the beam is located on an upper portion of the ingot, the beam separator removes the beam in a longitudinal direction of the beam at a position above the peeling tank, and the removed beam is discharged outside by the conveying unit.

6. The ASC process automation apparatus according to claim 5, further comprising:
   an unloading unit mounted adjacent to the wafer separation unit and configured to discharge the plurality of wafers outside.

7. The ASC process automation apparatus according to claim 6, wherein the unloading unit comprises an unloading robot configured to grasp the plurality of wafers and convey the plurality of wafers from the peeling tank.

\* \* \* \* \*